United States Patent
Yang

(10) Patent No.: US 10,418,275 B1
(45) Date of Patent: Sep. 17, 2019

(54) METHODS OF SEALING OPENINGS, AND METHODS OF FORMING INTEGRATED ASSEMBLIES

(71) Applicant: Micron Technology, Inc., Boise, ID (US)

(72) Inventor: Guangjun Yang, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/369,150

(22) Filed: Mar. 29, 2019

Related U.S. Application Data

(63) Continuation of application No. 16/007,361, filed on Jun. 13, 2018, now Pat. No. 10,290,534.

(51) Int. Cl.
*H01L 21/76* (2006.01)
*H01L 21/764* (2006.01)
*H01L 21/02* (2006.01)
*H01L 27/108* (2006.01)

(52) U.S. Cl.
CPC ...... *H01L 21/764* (2013.01); *H01L 21/02164* (2013.01); *H01L 21/02266* (2013.01); *H01L 27/10882* (2013.01)

(58) Field of Classification Search
CPC ............. H01L 21/764; H01L 21/02164; H01L 21/02264; H01L 27/10882

USPC ........................................................ 438/422
See application file for complete search history.

(56) References Cited

U.S. PATENT DOCUMENTS

| | | |
|---|---|---|
| 9,514,980 B2 | 12/2016 | Lee |
| 9,520,348 B2 | 12/2016 | Choi |
| 9,786,553 B1 | 10/2017 | Yang |
| 2011/0309430 A1 | 12/2011 | Purayath |
| 2016/0229687 A1 | 8/2016 | Wen et al. |
| 2017/0365658 A1 | 12/2017 | Cheng |

OTHER PUBLICATIONS

KR KR10-2013-0123687_Abst-FullRef, Nov. 13, 2013, Samsung Electronics Co Ltd.
KR KR10-2014-0123639_Abst-FullRef, Oct. 23, 2014, SK Hynix Inc.
WO PCT-US2019-016695_Srch_Rpt, dated May 21, 2019, Micron Technology, Inc.
WO PCT-US2019-016695_Written_Opin, dated May 21, 2019, Micron Technology, Inc.

*Primary Examiner* — David S Blum
(74) *Attorney, Agent, or Firm* — Wells St. John P.S.

(57) ABSTRACT

Some embodiments include a method of forming an integrated assembly. A construction is formed to include a structure having an exposed surface, and to include an opening proximate the structure. An aperture extends into the opening. A first material is deposited to form a mass along the exposed surface of the structure. Particles are sputtered from the mass and across the aperture. The particles agglomerate to form a sealant material which traps a void within the opening.

16 Claims, 17 Drawing Sheets

METHODS OF SEALING OPENINGS, AND METHODS OF FORMING INTEGRATED ASSEMBLIES

RELATED PATENT DATA

This patent resulted from a continuation of U.S. patent application Ser. No. 16/007,361, now U.S. Pat. No. 10,290,534, which was filed Jun. 13, 2018, and which is hereby incorporated herein by reference.

TECHNICAL FIELD

Methods of sealing openings, and methods of forming integrated assemblies.

BACKGROUND

Memory is one type of integrated circuitry, and is used in computer systems for storing data. An example memory is DRAM (dynamic random-access memory). DRAM cells may each comprise a transistor in combination with a capacitor. The DRAM cells may be arranged in an array; with wordlines extending along rows of the array, and digit lines extending along columns of the array. The wordlines may be coupled with the transistors of the memory cells. Each memory cell may be uniquely addressed through a combination of one of the wordlines with one of the digit lines.

Some DRAM may have the digit lines coupled to portions of active regions, and may have the capacitors coupled with interconnects which extend to other portions of the active regions. The interconnects may be proximate to the digit lines, and parasitic capacitance may problematically occur between the interconnects and the digit lines. It would be desirable to develop architectures which alleviate, or even entirely prevent, such parasitic capacitance; and to develop methods of forming such architectures.

A strategy for alleviating parasitic capacitance is to utilize low-k regions between neighboring conductive components. A particularly-desirable low-k region is a void region. However, it may be problematic to adequately seal void regions. Accordingly, it would be desirable to develop methods suitable for sealing void regions. It would be desirable for such methods to be applicable across a broad spectrum of integrated applications, including, but not limited to, solutions which alleviate or prevent the problem described above relative to the parasitic capacitance between interconnects and digit lines.

BRIEF DESCRIPTION OF THE DRAWINGS

FIGS. 3 and 5 are diagrammatic cross-sectional top-down views; and FIGS. 4, 6 and 7 are diagrammatic cross-sectional side views. The view of FIG. 3 is along the lines 3-3 of FIGS. 4 and 6. The view of FIG. 4 is along the lines 4-4 of FIGS. 3, 5, 6 and 7. The view of FIG. 5 is along the lines 5-5 of FIGS. 4, 6 and 7. The view of FIG. 6 is along the lines 6-6 of FIGS. 3, 4 and 5. The view of FIG. 7 is along the lines 7-7 of FIGS. 3, 4 and 5.

DETAILED DESCRIPTION OF THE ILLUSTRATED EMBODIMENTS

Some embodiments include methods of forming integrated assemblies in which sealant material is provided across openings to trap voids within the openings. The sealant material may be formed by a process which includes initially forming masses along structures associated with an integrated assembly, with the structures being proximate openings. Subsequently, particles are sputtered from the masses and deposited across the openings, with the deposited particles agglomerating to form the sealant material. Some embodiments include architectures in which voids are along sidewalls of first conductive structures, and are capped by insulative sealant material. Second conductive structures may be spaced from the first conductive structures by intervening regions comprising the voids. The intervening regions have low permittivity due to the low permittivity of the voids; and thus problematic parasitic capacitance between the first and second conductive structures may be avoided. In some embodiments, the first conductive structures may be digit lines, and the second conductive structures may be interconnects extending to capacitors (or other suitable charge-storage structures). Example embodiments are described with reference to FIGS. 1-17.

Figure 1:
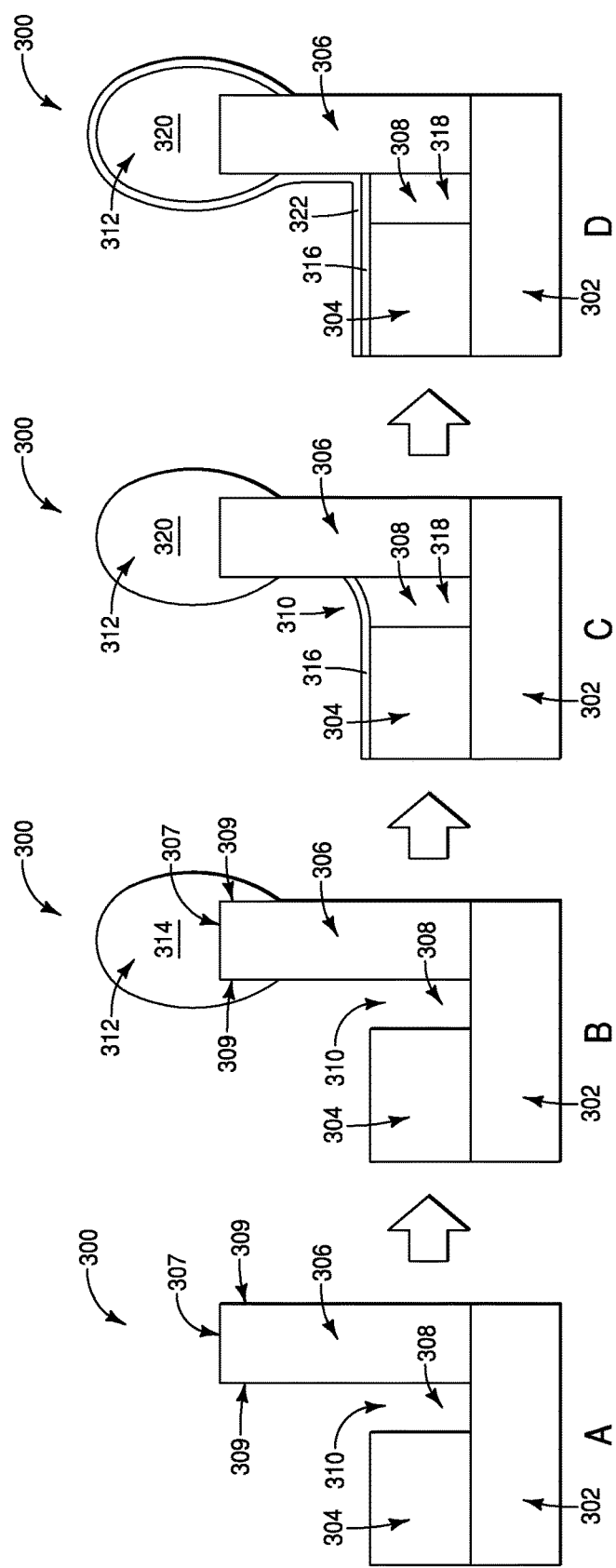
FIG. 1 shows diagrammatic cross-sectional side views of an example construction at example process stages of an example method.

Referring to FIG. 1, such shows a construction 300 at a preliminary process stage "A". The construction includes a base 302, and a pair of structures 304 and 306 over the base. An opening 308 is between the structures 304 and 306, and an aperture 310 extends into the opening.

The base 302 may comprise any suitable composition(s); and may include conductive material, insulative material and/or semiconductor material. Similarly, the structures 304 and 306 may comprise any suitable composition(s); and may include conductive material, insulative material and/or semiconductor material. The base 302, structure 304 and structure 306 may all comprise a same composition as one another; or at least one of them may comprise a different composition relative to one or both of the others.

In some embodiments, the structure 306 may be considered to correspond to a pillar or rail. The structure 306 has a top surface 307, and has sidewall surfaces 309 extending downwardly from the top surface.

A mass 312 is formed along an upper region of the structure 306 as shown at a process stage "B" of FIG. 1. The mass 312 is along the top surface 307 of the structure 306, and along upper segments of the sidewall surfaces 309 of such structure.

The mass 312 may be formed by depositing a first material 314 along some of the exposed surfaces of the structure 306, with such deposition being conducted under conditions which form the material along the highest features of the construction 300.

The first material 314 may comprise any suitable composition; and in some embodiments may comprise one or more elements selected from group 14 of the periodic table (e.g., may comprise silicon, carbon, germanium, etc.).

The deposition of the first material 314 may utilize any suitable precursor(s); and in some embodiments may utilize a precursor comprising one or both of a halide and a hydride of at least one element selected from group 14 of the periodic table (e.g., may comprise one or more of $SiCl_4$, $SiH_4$, etc.). The resulting first material 314 may comprise the element selected from group 14 of the periodic table (e.g., silicon) in combination with one or more other components of the precursor(s). For instance, in some embodiments the first material 314 may comprise silicon in combination with one or both of chlorine and hydrogen.

The deposition of the material 314 may utilize any suitable methodology; including, for example, one or more of chemical vapor deposition (CVD), plasma-enhanced chemical vapor deposition (PECVD), atomic layer deposition (ALD), etc.

Example conditions which may be utilized for the deposition of the material 314 may include a bias voltage on the construction 300 within a range of from about 50 volts (V) to about 2000 V, while the construction is in a suitable reaction chamber (e.g., a dry etch chamber). The conditions may include flow of one or more suitable precursors into the reaction chamber (e.g., silicon tetrachloride, $SiCl_4$) together with one or more suitable inert carrier gases (e.g., argon, nitrogen, helium, etc.). The deposition may be conducted while maintaining an ambient within the reaction chamber to a temperature within a range of from about 10° C. to about 100° C., and to a pressure within a range of from about 1 millitorr (mTorr) to about 200 mTorr. Plasma conditions may or may not be utilized during the deposition. If plasma conditions are utilized, the plasma may be remote relative to the construction 300 or may directly contact surfaces of the construction 300.

Particles are sputtered from the mass 312, and such particles agglomerate to form a sealant material 316 which extends across the aperture 310 and traps a void 318 within the opening 308, as shown at a process stage "C" of FIG. 1. In some embodiments, some of the sealant material 316 may extend into the opening 308. However, the sealant material does not generally fill the opening, and accordingly there will generally be a void remaining within the opening.

The conditions utilized to sputter the particles from the mass 312 may be oxidizing conditions, and the sealant material 316 may comprise an oxidized element from the first material 314 of process stage "B". For instance, in some embodiments the first material 314 may comprise one or more elements from group 14 of the periodic table (e.g., silicon) and the sealant material 316 may comprise one or more oxides of the elements from group 14 of the periodic table (e.g., may comprise silicon dioxide). The oxidizing conditions may also convert the first material 314 of the mass 312 into a material 320 comprising oxidized components of the first material 314. For instance, the material 320 may comprise oxides of one or more elements from group 14 of the periodic table. Further, the oxidizing conditions may remove halides (e.g., chlorine) and/or hydrogen from the material 314 so that the material 320 and the sealant material 316 consist of, or consist essentially of, one or more oxides of elements of group 14 of the periodic table (e.g., silicon oxide, germanium oxide, etc.).

Example conditions which may be utilized for the sputtering of particles from the mass 312 and the associated formation of the sealant material 316 may include a bias voltage on the construction 300 within a range of from about 50 volts (V) to about 2000 V, while the construction is in a suitable reaction chamber (e.g., a dry etch chamber). The sputtering of particles from mass 312 may occur in a same reaction chamber as was utilized for the forming of the mass 312, or may occur in a different reaction chamber from that utilized for forming the mass. In some embodiments, the bias voltage used during the deposition of the mass 312 may be referred to as a first bias voltage, and the bias voltage used during the sputtering of particles from the mass 312 may be referred to as a second bias voltage. The first and second bias voltages may be the same as one another, or may be different relative to one another.

The conditions used during the sputtering of particles from the mass 312 may include flow of one or more suitable oxidants into the reaction chamber (e.g., diatomic oxygen, $O_2$; ozone, $O_3$; hydrogen peroxide, $H_2O_2$; etc.) together with one or more suitable inert carrier gases (e.g., argon, nitrogen, helium, etc.). The sputtering of particles from the mass 312 may be conducted while maintaining an ambient within the reaction chamber to a temperature within a range of from about 10° C. to about 100° C., and to a pressure within a range of from about 1 millitorr (mTorr) to about 500 mTorr. Plasma conditions may or may not be utilized during the sputtering. If plasma conditions are utilized, the plasma may be remote relative to the construction 300 or may directly contact surfaces of the construction 300.

In some embodiments, the deposition of mass 312 (process step "B") and the sputtering of particles from the mass to form sealant material 316 (process step "C") are conducted in the same reaction chamber as one another. In such embodiments, the sputtering may occur simultaneously with some of the deposition (i.e., chemical species associated with the deposition may be in the reaction chamber at the same time as chemical species associated with the sputtering). Alternatively, the sputtering may occur substantially entirely after the deposition (i.e., chemical species associated with the sputtering may be provided in the reaction chamber only after the chemical species associated with the deposition are entirely evacuated from the chamber, or are at least substantially entirely evacuated from the chamber).

In embodiments in which the sputtering of particles from the mass 312 occurs simultaneously with at least some of the deposition of the mass 312, the ambient within the reaction chamber utilized for the sputtering and deposition may include a halogen-containing precursor (e.g., silicon tetrachloride) and/or a hydrogen-containing precursor (e.g., silane) in combination with one or more oxygen-containing chemical species (e.g., diatomic oxygen, ozone, hydrogen peroxide, etc.). The chemical species may or may not be dispersed within a plasma.

In some embodiments, pinholes or other defects may extend partially or entirely through the sealant material 316. Such defects may or may not be problematic. To the extent that the defects are considered problematic, such may be alleviated by treating the sealant material. For instance, the sealant material may be subjected to a thermal anneal at a temperature of at least about 500° C. to collapse pinholes and/or otherwise cure problematic defects. Alternatively, or additionally, a layer may be deposited over the sealant material to cover the pinholes and/or other defects. In some embodiments, such layer may comprise insulative material; such as, for example, silicon nitride and/or silicon dioxide. Process step "D" shows construction 300 after an optional layer of material 322 is provided over the sealant material 316. The material 322 may comprise a same composition as the sealant material 316 (e.g., both may comprise, consist essentially of, or consist of silicon oxide); or may comprise a different composition relative to the sealant material (e.g., the sealant material 316 may comprise silicon dioxide while the material 322 comprises silicon nitride).

The material 322 may be provided to any suitable thickness; and in some embodiments may have a thickness within a range of from about 10 Å to about 500 Å.

Figure 2:
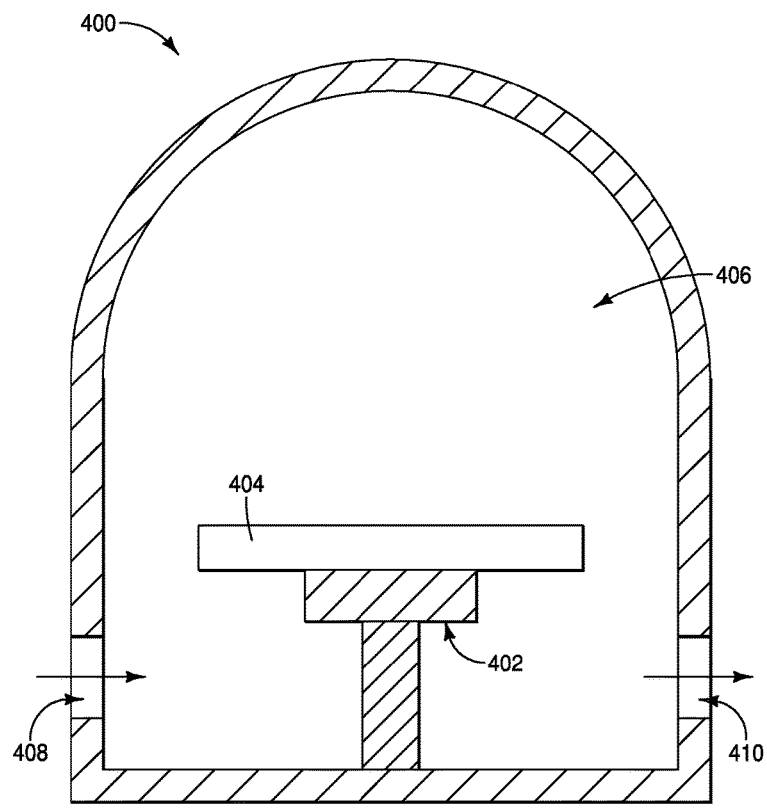
FIG. 2 is a diagrammatic cross-sectional side view of an example reaction chamber.

The various process stages of FIG. 1 may be conducted in any suitable reaction chamber, or any suitable combination of reaction chambers. FIG. 2 diagrammatically illustrates an example reaction chamber 400. A chuck 402 is provided to retain a substrate 404 within the chamber. The substrate 404 may be a semiconductor wafer comprising a construction analogous to the construction 300 of FIG. 1. The chamber 400 includes an interior region 406 which retains an ambient within the chamber. Openings 408 and 410 extend through a wall of the chamber, and are utilized to flow materials into and out of the chamber. Valves (not shown) may be provided across the openings 408 and 410.

The voids 318 formed utilizing the processing of FIG. 1 may be useful during fabrication of integrated circuitry. For instance, the voids may correspond to low-k (low dielectric constant) insulative regions suitable for electrically isolating neighboring conductive structures from one another. An advantage of utilizing low-k regions is that such may reduce parasitic capacitance as compared to insulative regions having higher dielectric constants.

An example application for processing analogous to that of FIG. 1 is the fabrication of integrated DRAM. An example process for fabricating DRAM is described with reference to FIGS. 3-17.

Referring to FIGS. 3-7, a portion of an example construction 10 is illustrated. Such construction may be formed with any suitable methodology. The construction 10 is an example of an initial construction which may be utilized for some of the embodiments described herein, and it is to be understood that other constructions may be utilized alternatively to the construction 10.

The construction 10 includes a plurality of active regions 12 extending upwardly from a semiconductor base 14. Some of the active regions 12 are labeled as 12a-f so that they may be distinguished relative to one another, and relative to others of the active regions. All of the active regions 12 may be substantially identical to one another; with the term "substantially identical" meaning identical to within reasonable tolerances of fabrication and measurement.

The active regions 12 and semiconductor base 14 comprise semiconductor material 16. Such semiconductor material may comprise any suitable composition(s); and in some embodiments may comprise, consist essentially of, or consist of one or more of silicon, germanium, III/V semiconductor material (e.g., gallium phosphide), semiconductor oxide, etc.; with the term III/V semiconductor material referring to semiconductor materials comprising elements selected from groups III and V of the periodic table (with groups III and V being old nomenclature, and now being referred to as groups 13 and 15). In some embodiments, the semiconductor material 16 may comprise, consist essentially of, or consist of appropriately-doped silicon. The silicon may be in any suitable form; and in some embodiments may be monocrystalline silicon.

The base 14 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above.

The active regions 12 are spaced from one another by intervening regions comprising insulative material 18. The insulative material 18 may comprise any suitable composition or combination of compositions; and in some embodiments may comprise, consist essentially of, or consist of silicon dioxide.

Figure 5:
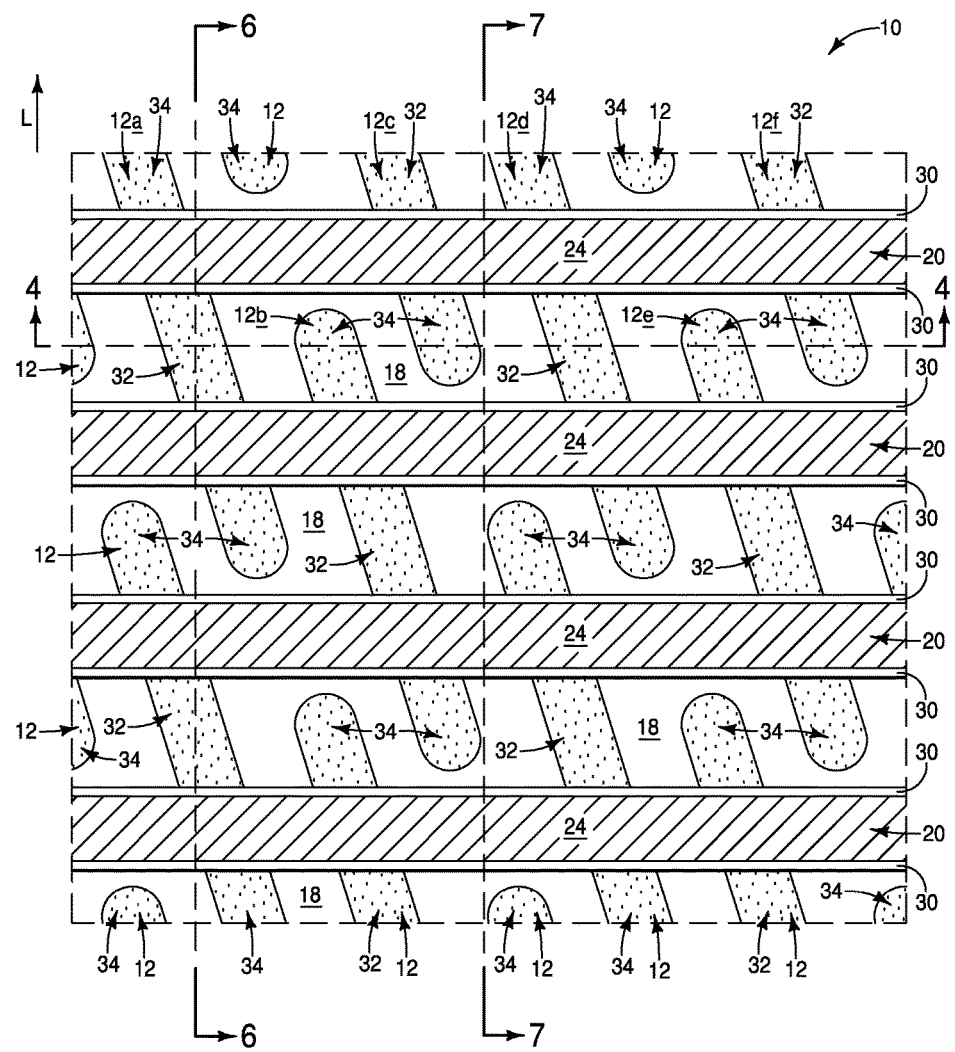

Wordlines (i.e., access lines) 20 extend along a first direction which may ultimately correspond to a row direction of a memory array; and digit lines (i.e., sense lines, bitlines) 22 extend along a second direction which may ultimately correspond to a column direction of the memory array. In the shown embodiment, the second direction of the bitlines 22 is substantially orthogonal to the first direction of the wordlines 20. The wordlines are not indicated in FIG. 3 in order to enable the active regions 12 to be fully illustrated. In practice, the wordlines pass through regions of the active regions 12 as shown in FIG. 5.

The wordlines 20 comprise conductive material 24, and the bitlines 22 comprise conductive material 26. The conductive materials 24 and 26 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the conductive materials 24 and 26 may be a same composition as one another; and in other embodiments the conductive materials 24 and 26 may be different compositions relative to one another.

Insulative material 28 is over the wordlines 20. Such insulative material may comprise any suitable composition(s); and in some embodiments may comprise, consist essentially of, or consist of silicon dioxide. The insulative 28 may be the same composition as the insulative material 18, or may be a different composition relative to the insulative material 18.

Gate dielectric material 30 extends around lower regions of the wordlines 20, and is between the wordlines and the active regions 12. The gate dielectric material 30 may comprise any suitable composition(s); and in some embodiments may comprise, consist essentially of, or consist of silicon dioxide.

Figure 6:
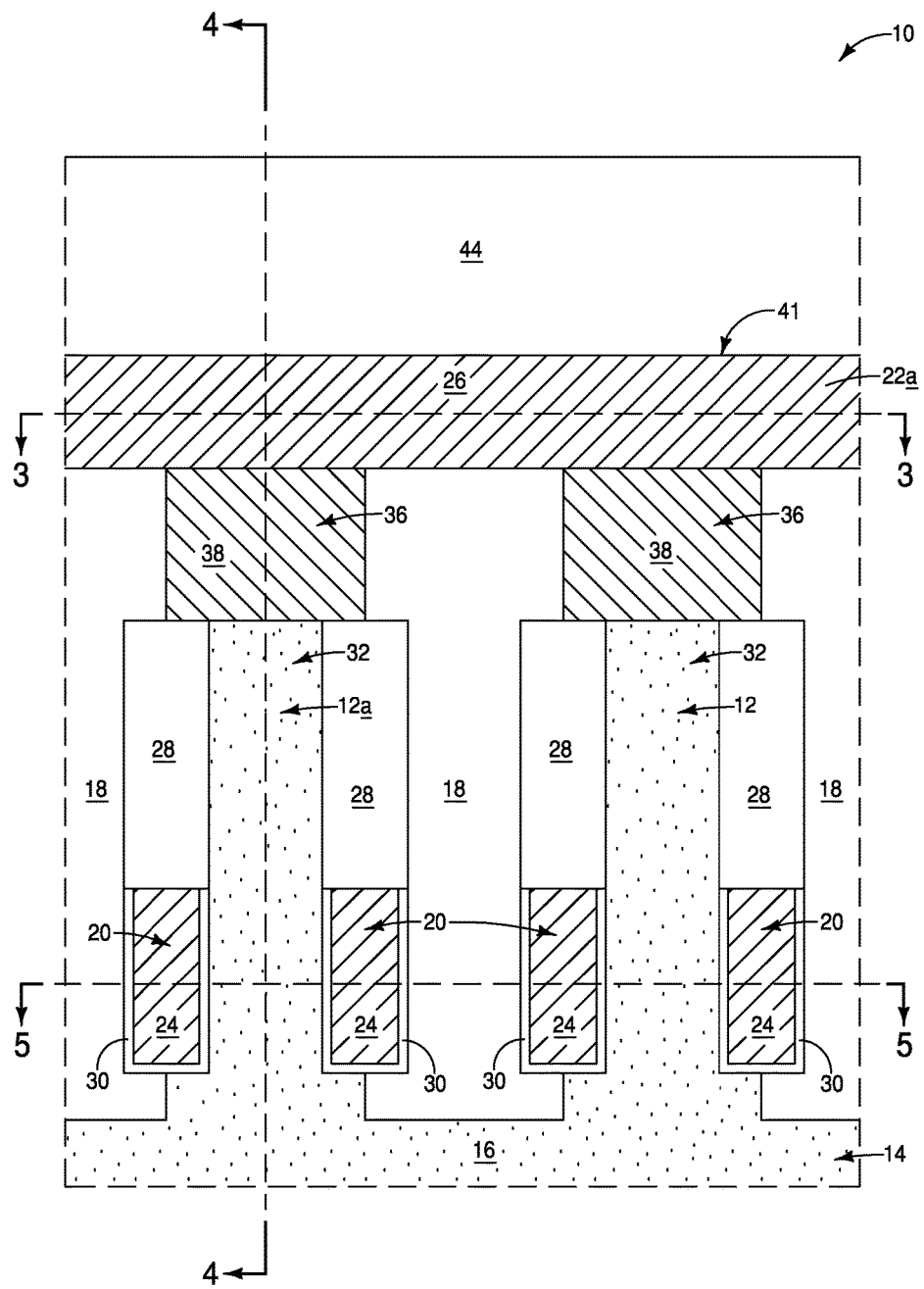
Figure 7:
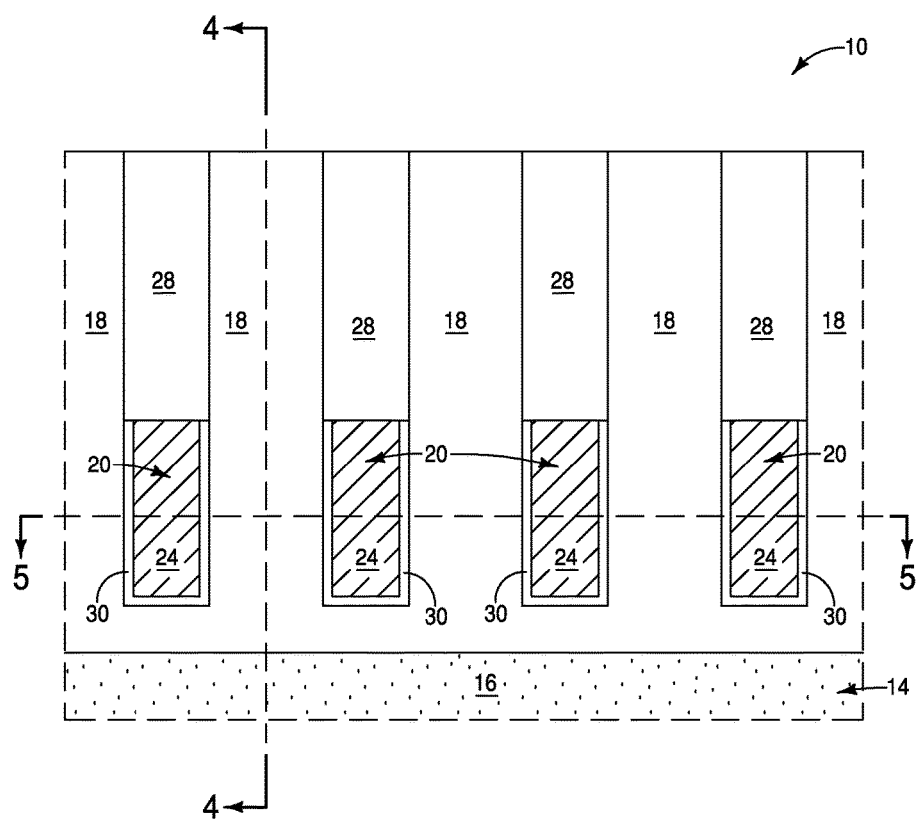

The wordlines 20 comprise transistor gates along the active regions 12. Each of the active regions may be considered to comprise a digit-line-contact portion 32, and a capacitor-contact portion 34. The transistor gates electrically couple the digit-line-contact portions with the capacitor-contact portions. The digit-line-contact portions 32 and the capacitor-contact portions 34 are indicated in FIG. 5 to assist the reader in understanding the relative locations of the wordlines 20 relative to the digit-line-contact portions 32 and the capacitor-contact portions 34. However, it is to be understood that the digit-line-contact portions 32 and the capacitor-contact portions 34 are actually higher up on the active regions than the section of FIG. 5, as is indicated in FIGS. 4 and 6.

The digit-line-contact portions 32 are coupled with electrical interconnects 36, which in turn are coupled with the digit lines 22. The interconnects 36 comprise conductive material 38. The conductive material 38 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.).

The digit lines 22 are labeled as 22a-d so that they may be distinguished relative to one another. FIG. 4 shows a cross-section in which the digit lines 22a and 22c are coupled with digit-line-contact locations 32, and in which the digit lines 22b and 22d are passing over the capacitor-contact locations 34. The passing digit lines 22b and 22d are spaced from the underlying capacitor-contact locations 34 by insulative materials 40 and 42. Such insulative materials may comprise any suitable composition(s); and in some embodiments may comprise, consist essentially of, or consist of silicon dioxide, silicon nitride, etc. The insulative materials 40 and 42 may be a same composition as one another, or may be different compositions relative to one another.

Figure 4:
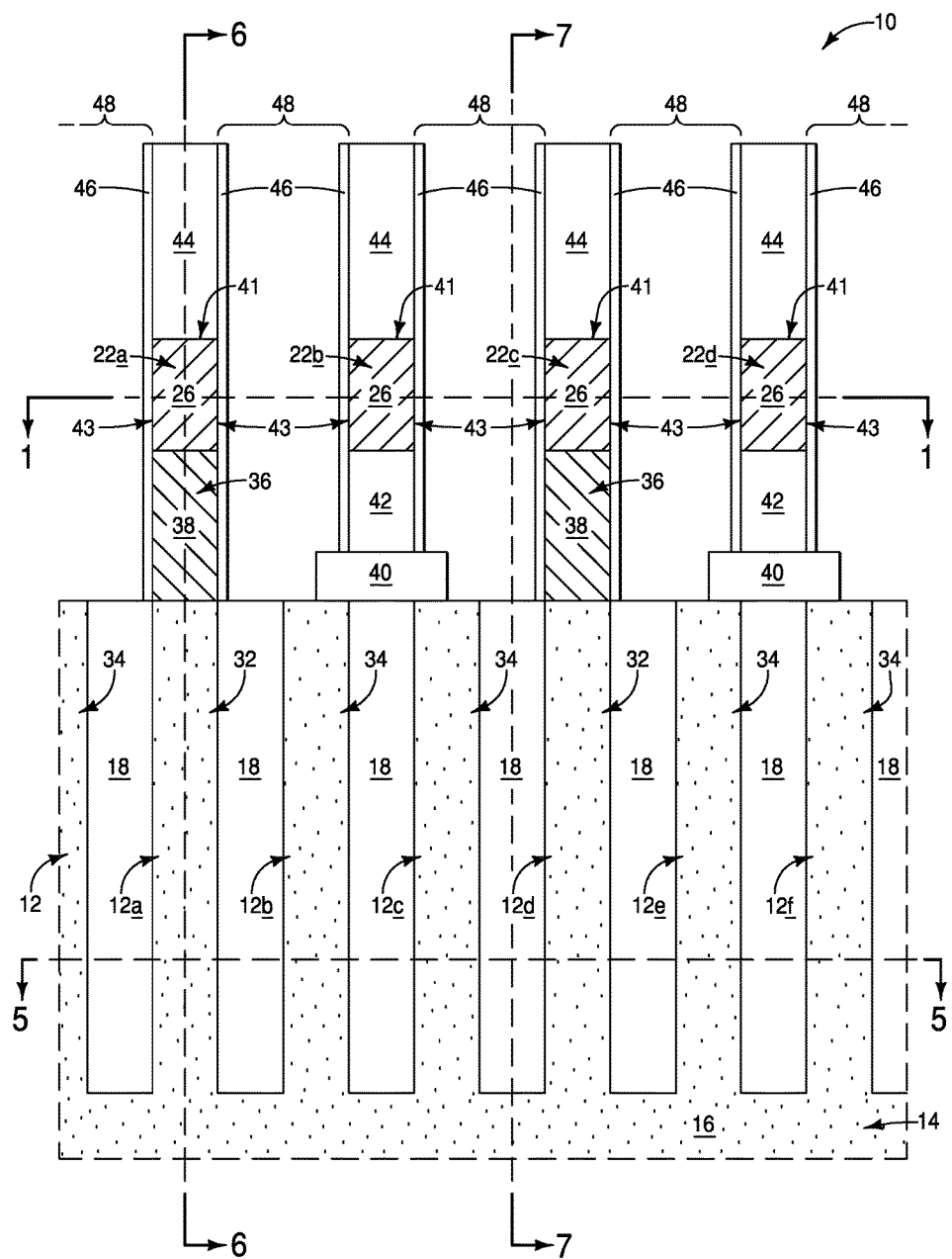

The digit lines 22 may be considered to be conductive structures having top surfaces 41 and sidewall surfaces 43; with each of the digit lines having a pair of opposing sidewall surfaces 43 along the cross-section of FIG. 4.

Insulative material 44 is over the top surfaces 41 of the conductive structures 22. The insulative material 44 may comprise any suitable composition(s); and in some embodiments may comprise, consist essentially of, or consist of silicon nitride.

Insulative material 46 is along the sidewall surfaces 43 of the conductive structures 22. The insulative material 46 may comprise any suitable composition(s); and in some embodiments may comprise, consist essentially of, or consist of silicon nitride. It is noted that in some embodiments the materials 44 and 46 may comprise a common composition (e.g., silicon nitride), and accordingly may merge into a single insulative structure.

FIG. 4 shows the conductive structures 22 spaced from one another by intervening regions 48. The insulative material 46 may be considered to be formed within such intervening regions.

Figure 8:
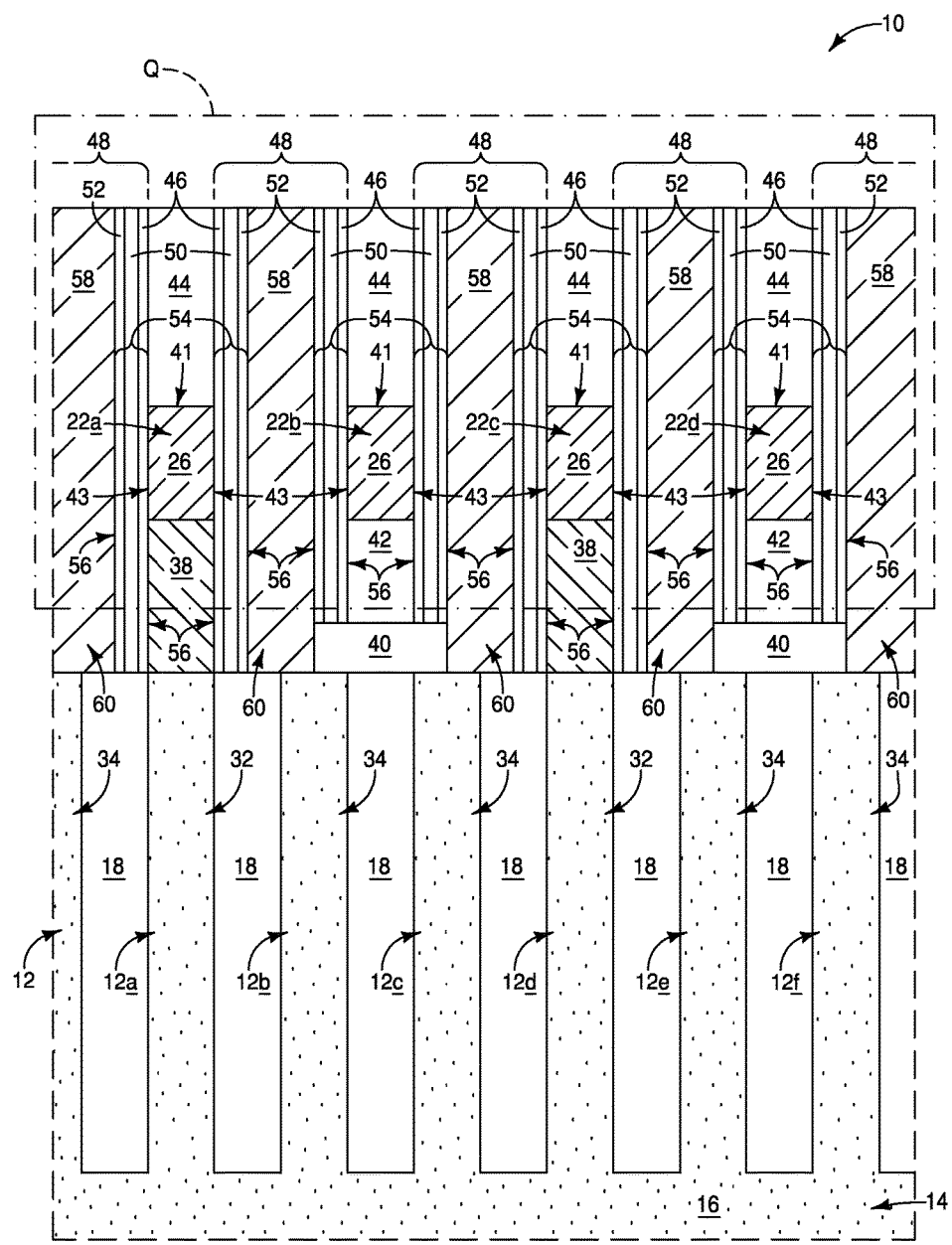
FIG. 8 is a view along the same cross-section as FIG. 4, and shows the construction of FIGS. 3-7 at an example process stage following that of FIGS. 3-7.

Referring to FIG. 8, a region of construction 10 is shown at a processing stage following that of FIGS. 3-7; with such region being shown along the same cross-section as described above relative to FIG. 4.

The processing stage of FIG. 8 has additional insulative materials 50 and 52 formed within the intervening regions 48. The insulative materials 50 and 52 may comprise any suitable composition(s). In some embodiments, the material 50 is a sacrificial material which may be removed selectively relative to the materials 44, 46 and 52. In some embodiments, the sacrificial material 50 may comprise, consist essentially of, or consist of silicon dioxide; while the materials 44, 46 and 52 may all comprise, consist essentially of, or consist of silicon nitride.

Figure 3:
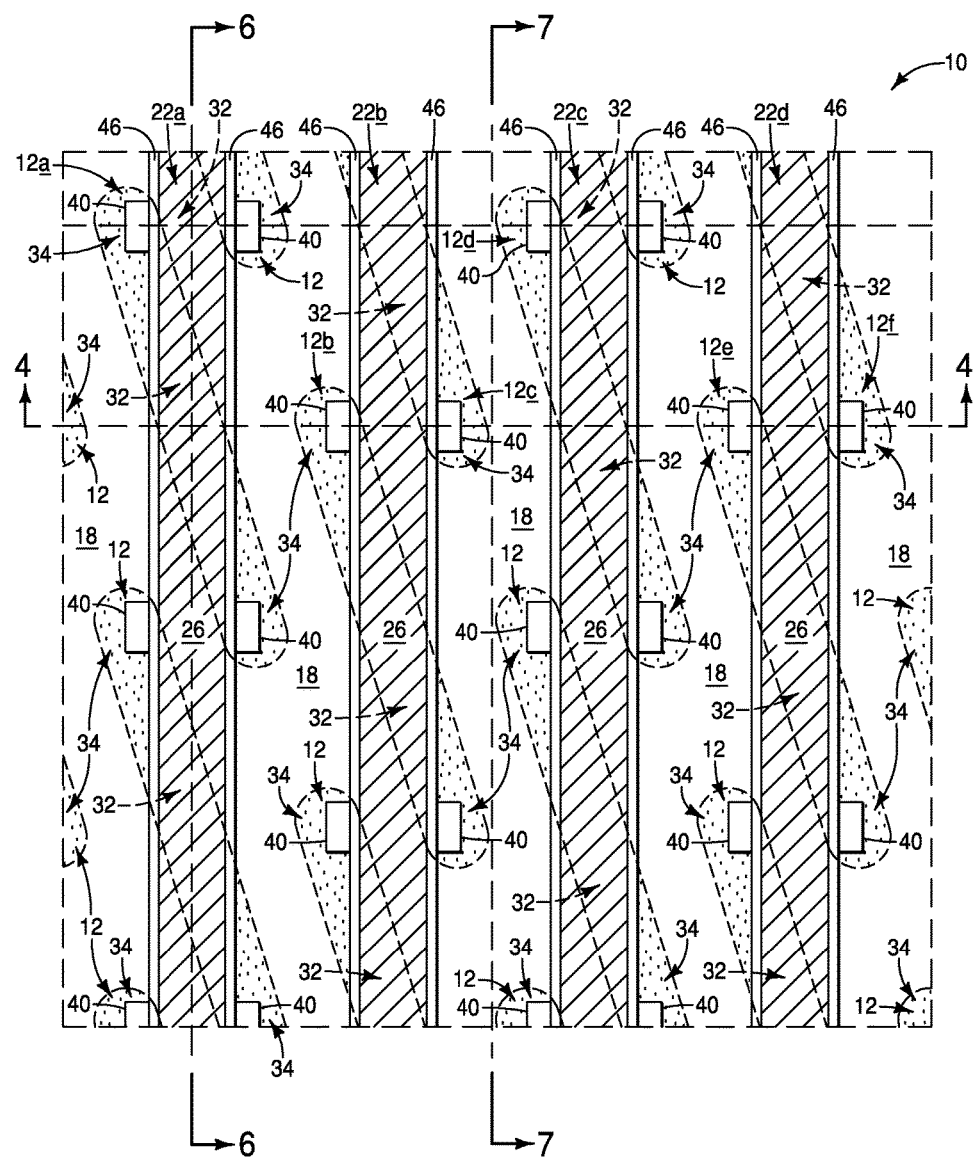
FIGS. 3-7 are diagrammatic views of a region of an example construction.

In some embodiments, the materials 46, 50 and 52 may be considered together to form rails 54, with such rails extending into and out of the page relative to the cross-section of FIG. 8 (i.e., with such rails extending along the digit lines 22 shown in FIG. 3).

The rails 54 may be considered to comprise the sacrificial material 50 between a pair of panels 56; with such panels comprising the non-sacrificial materials 46 and 52.

Conductive material 58 is formed within the intervening regions 48 between the rails 54. The conductive material 58 forms conductive interconnects 60 which extend to the capacitor-contact locations 34 of the active regions 12.

The conductive material 58 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.).

Figure 9:
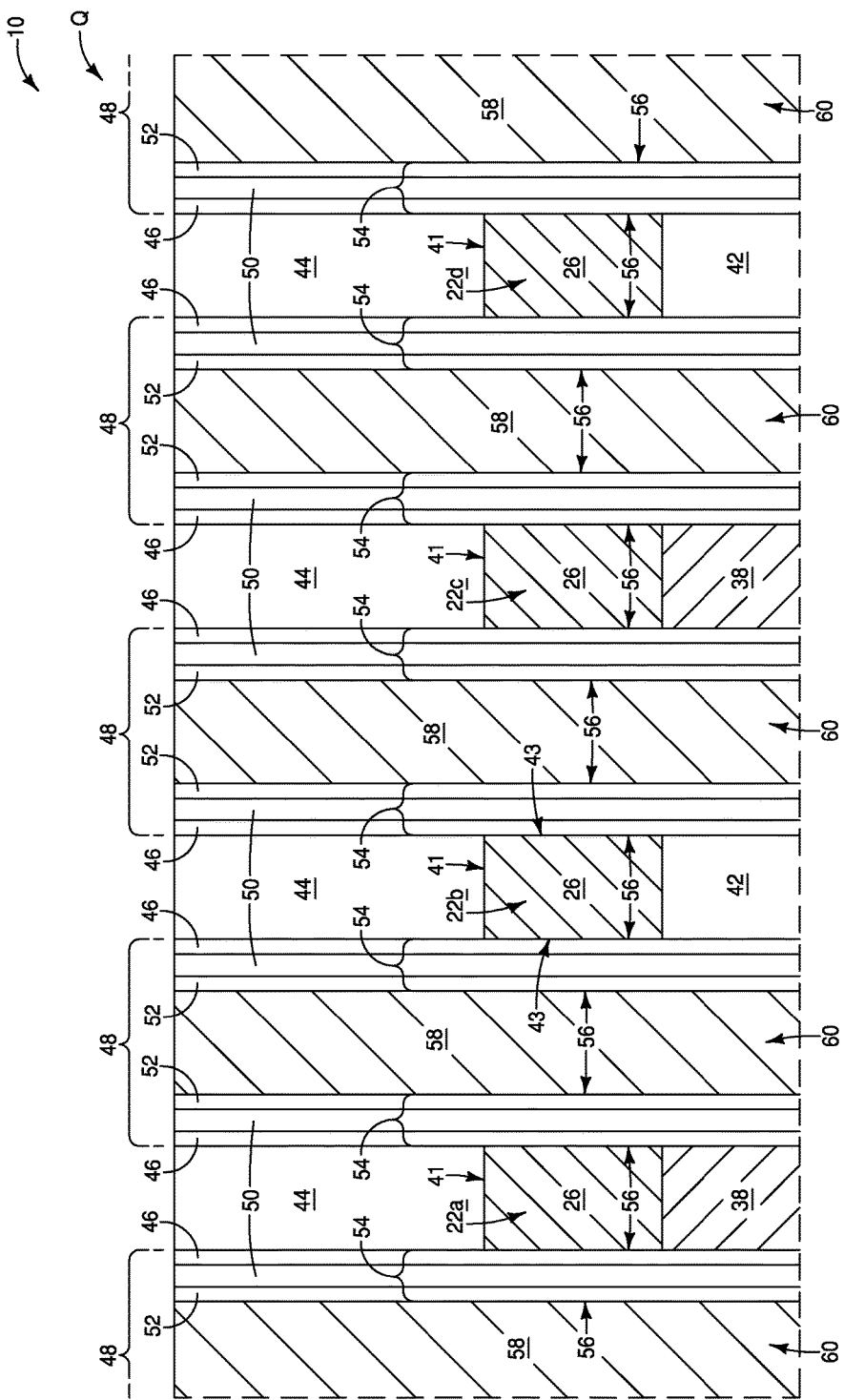
FIG. 9 is a diagrammatic cross-sectional view of a region "Q" of FIG. 8 at the same process stage as FIG. 8.

The processing which follows pertains to structures fabricated within an upper portion of the construction 10 of FIG. 8. Such upper portion is diagrammatically illustrated in FIG. 8 as corresponding to a region "Q". The region "Q" is shown in FIG. 9, and is utilized for describing the embodiments which follow. The processing stage of FIG. 9 is identical to that of FIG. 8.

Figure 10:
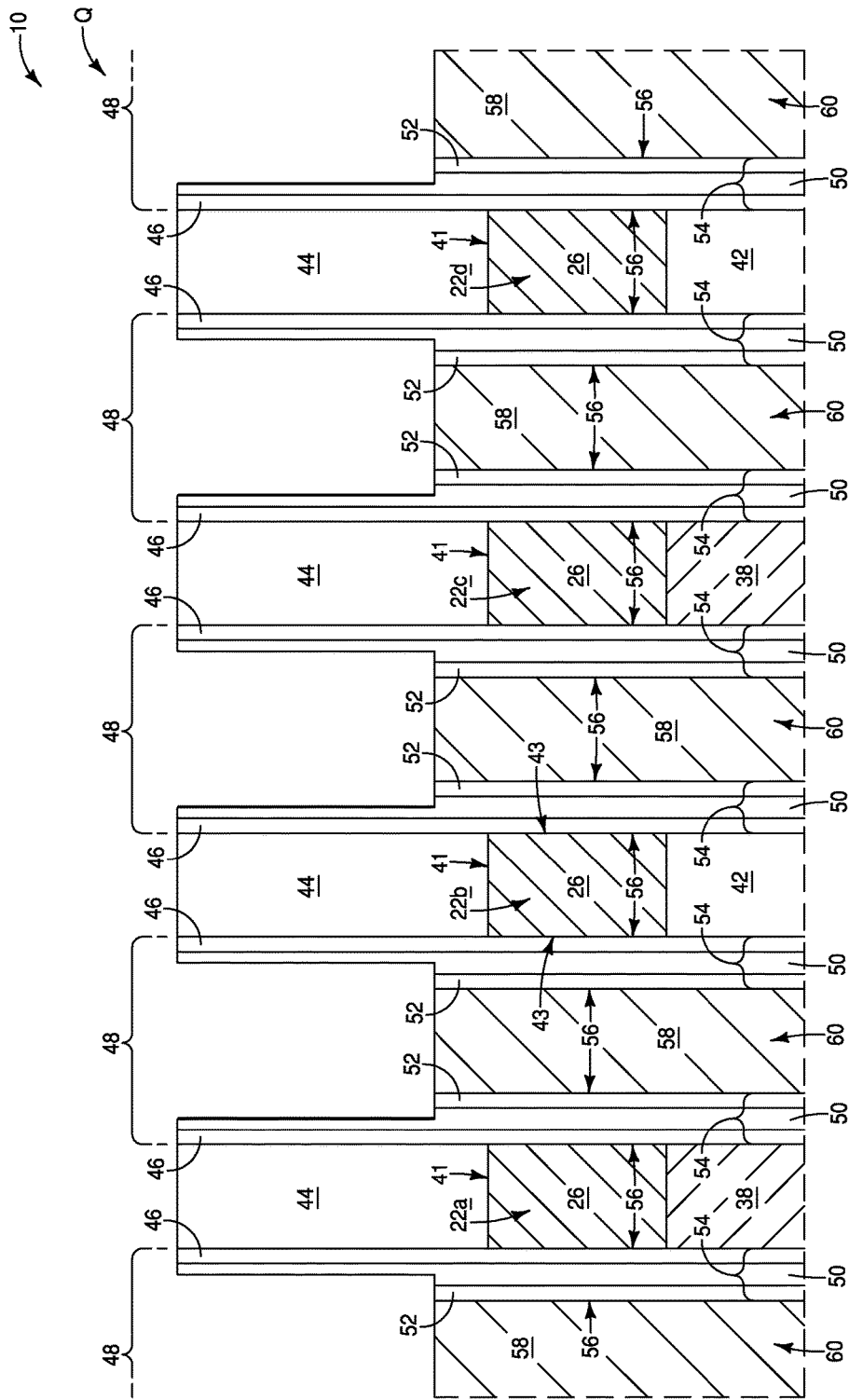
FIGS. 10-16 are diagrammatic cross-sectional views of the region "Q" of FIG. 9 at example process stages which may follow the process stage of FIG. 9.

Referring to FIG. 10, portions of the materials 50, 52 and 58 within the intervening regions 48 are recessed. Such may be accomplished utilizing a mask (not shown) to protect some regions of the construction 10, while leaving other regions exposed to suitable etching which recesses the exposed regions. Subsequently, the protective mask may be removed to leave the construction shown in FIG. 10. Alternatively, at least some portions of the mask may remain at the process stage of FIG. 10.

Figure 11:
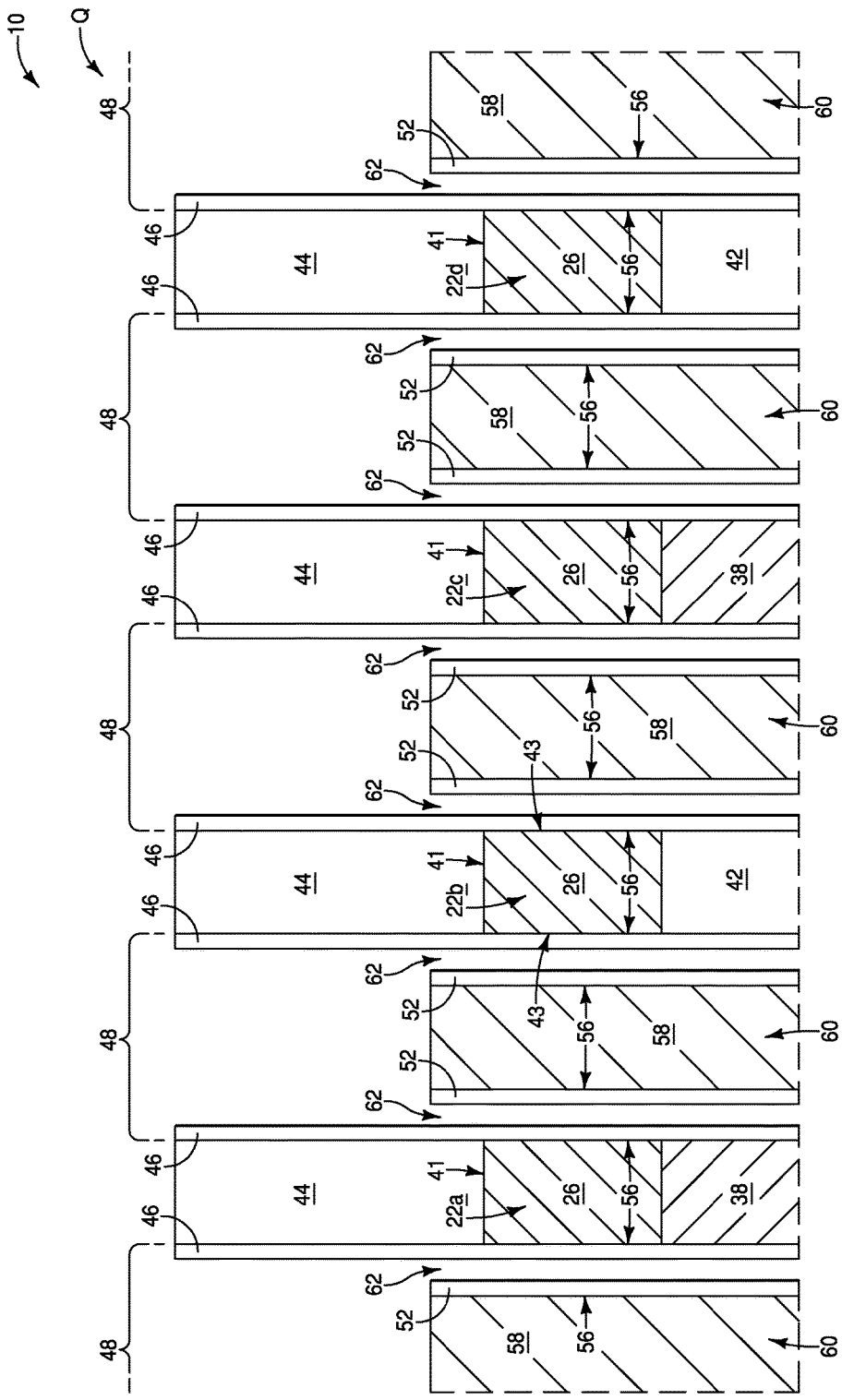

Referring to FIG. 11, the sacrificial material 50 (FIG. 10) is removed selectively relative to the materials 44, 46, 52 and 58 to leave openings 62 remaining between the panels 56. The bottoms of the openings 62 are not shown in FIG. 11; but would be capped by the materials 18 and 40 shown in FIG. 8.

Figure 12:
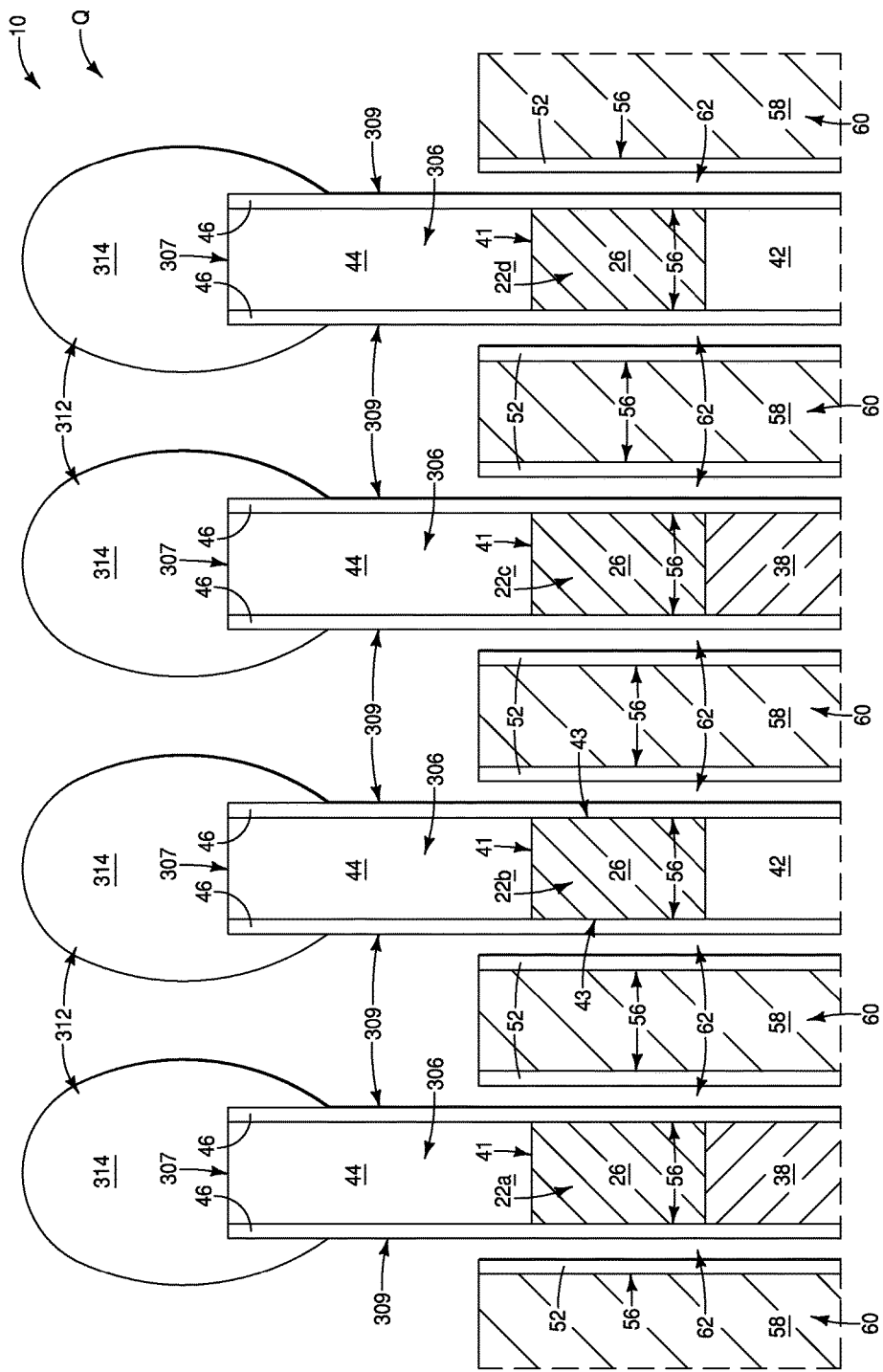

Referring to FIG. 12, the construction 10 is shown at a processing stage subsequent to that of FIG. 11, and analogous to the stage "B" of FIG. 1. Specifically, the materials 26, 38, 44 and 46 may be considered to form structures 306 analogous to the structures described above with reference to FIG. 1.

Masses 312 are formed over tops of the insulative materials 44 and 46, and along upper segments of the sides of the structures 306.

The masses 312 are analogous to the mass described above with reference to FIG. 1, and comprise the material 314. The masses 312 of FIG. 12 may be formed utilizing the same processing as described with reference to FIG. 1.

Figure 13:
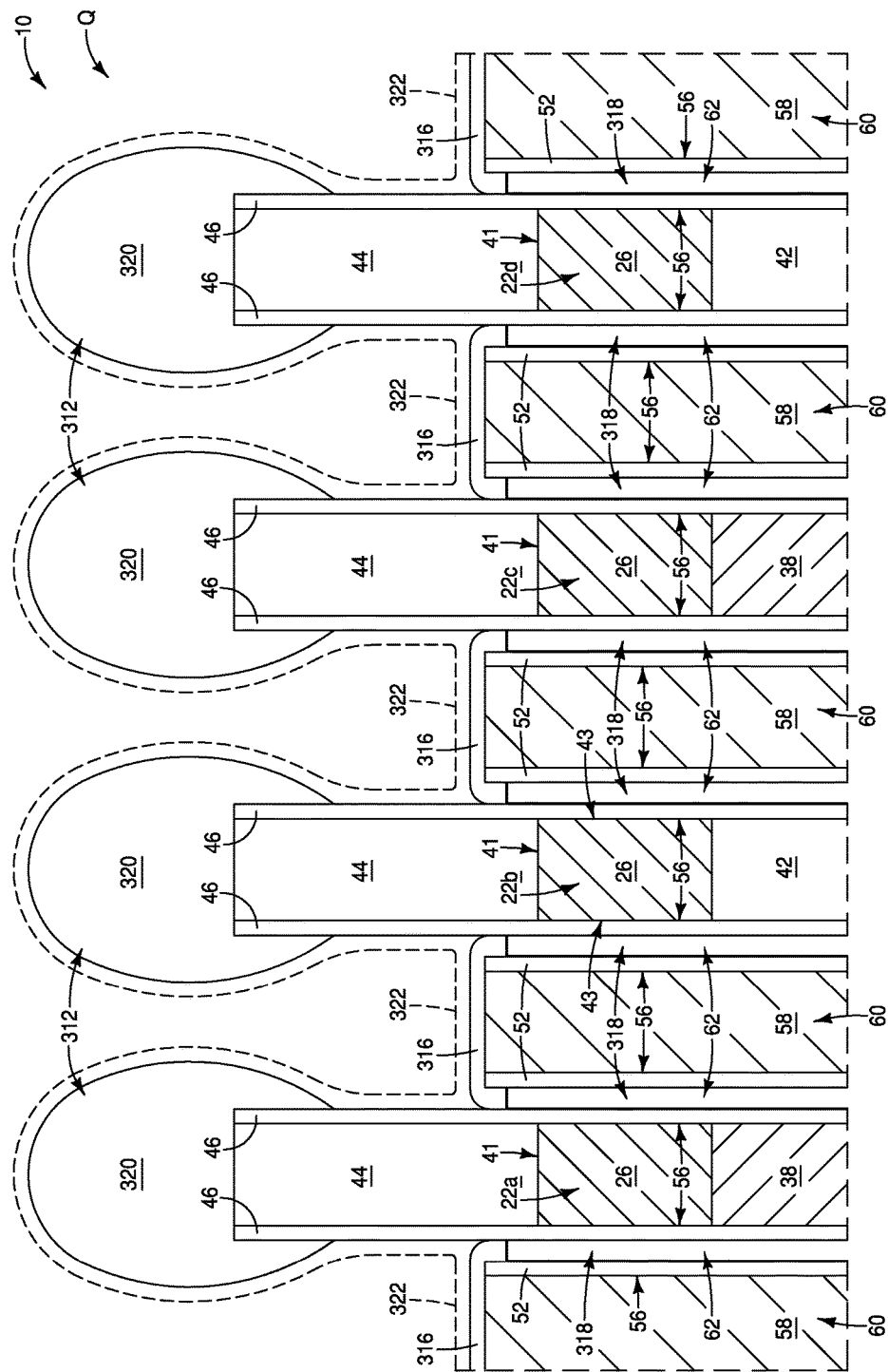

Referring to FIG. 13, the construction 10 is shown at a processing stage subsequent to that of FIG. 12. Specifically, particles are sputtered from the masses 312 and utilized to form the sealant material 316 which extends across the openings 62 and traps voids 318 within the openings (i.e., processing analogous to that of the process stage "C" of FIG. 1). The sealant material 316 of FIG. 13 may be generated utilizing the process conditions of FIG. 1.

An optional process is to treat the sealant material 316 to fill any pinholes present in such material and/or to cure other potential defects. Such treatment may comprise methodology described above with reference to a process stage "D" of FIG. 1. For instance, the methodology may comprise a thermal treatment and/or may comprise formation of a layer of material 322 over the sealant material 316. The optional layer of material 322 is shown in dashed-line view in FIG. 13, with the dashed-line view being utilized to emphasize that the layer is optional. In embodiments in which the material 322 is utilized, such material may be referred to as a second insulative material to distinguish it from the first insulative material 44.

Figure 14:
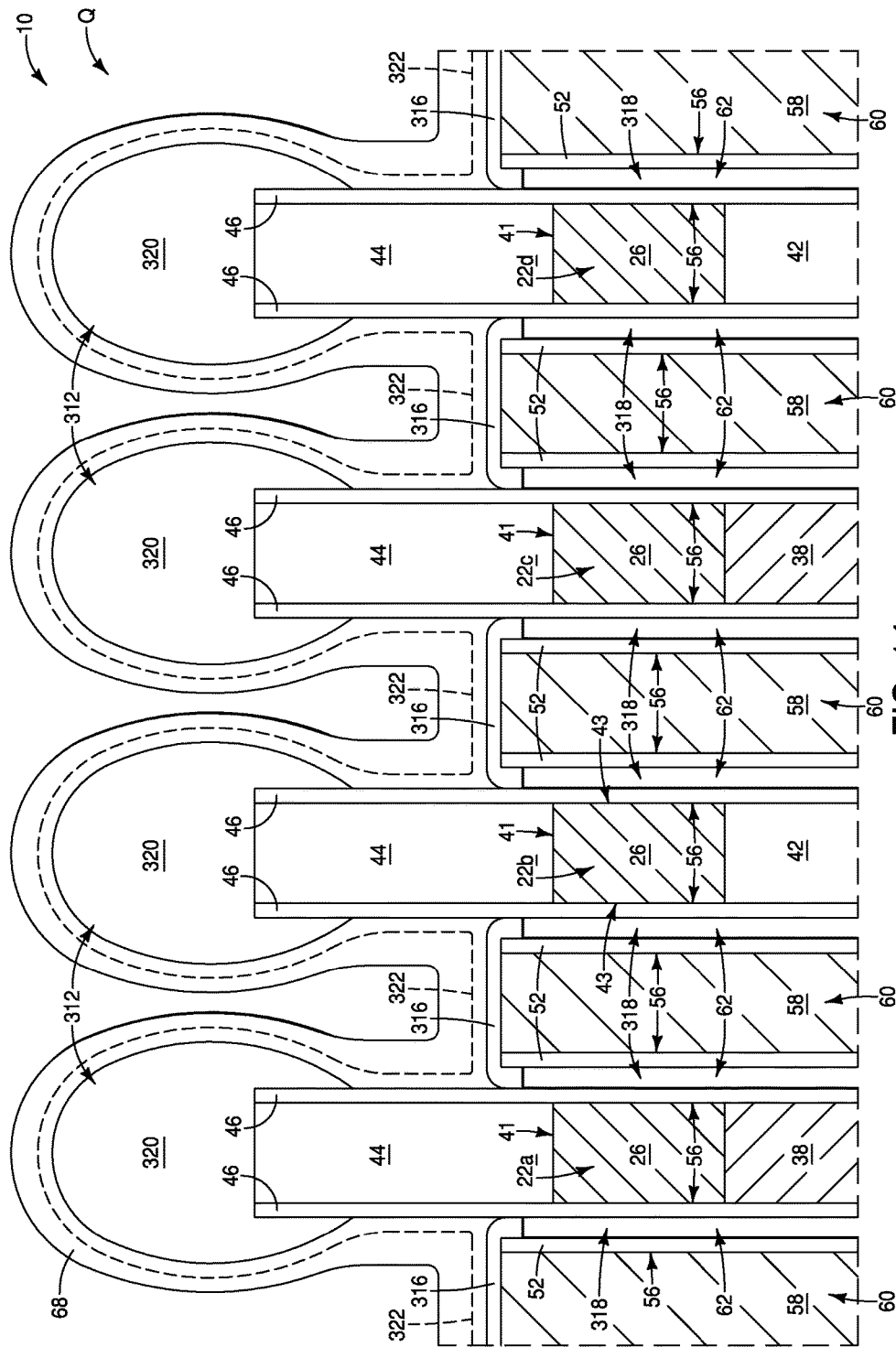

Referring to FIG. 14, insulative material 68 is formed over the masses 320, over the insulative structures under such masses (i.e., the structures comprising insulative 44), across the sealant material 316, and across the conductive interconnects 60. In some embodiments, the masses 320 may be removed prior to forming the insulative material 68. The insulative material 68 extends over the optional material 322. In some embodiments, the insulative material 68 may be referred to as a second insulative material to distinguish it from the first insulative material 44; and in some embodiments the insulative material 68 may be referred to as a third insulative material to distinguish it from the first and second insulative materials 44 and 322.

The insulative material 68 may comprise any suitable composition(s); and in some embodiments may comprise, consist essentially of, or consist of silicon nitride.

Figure 15:
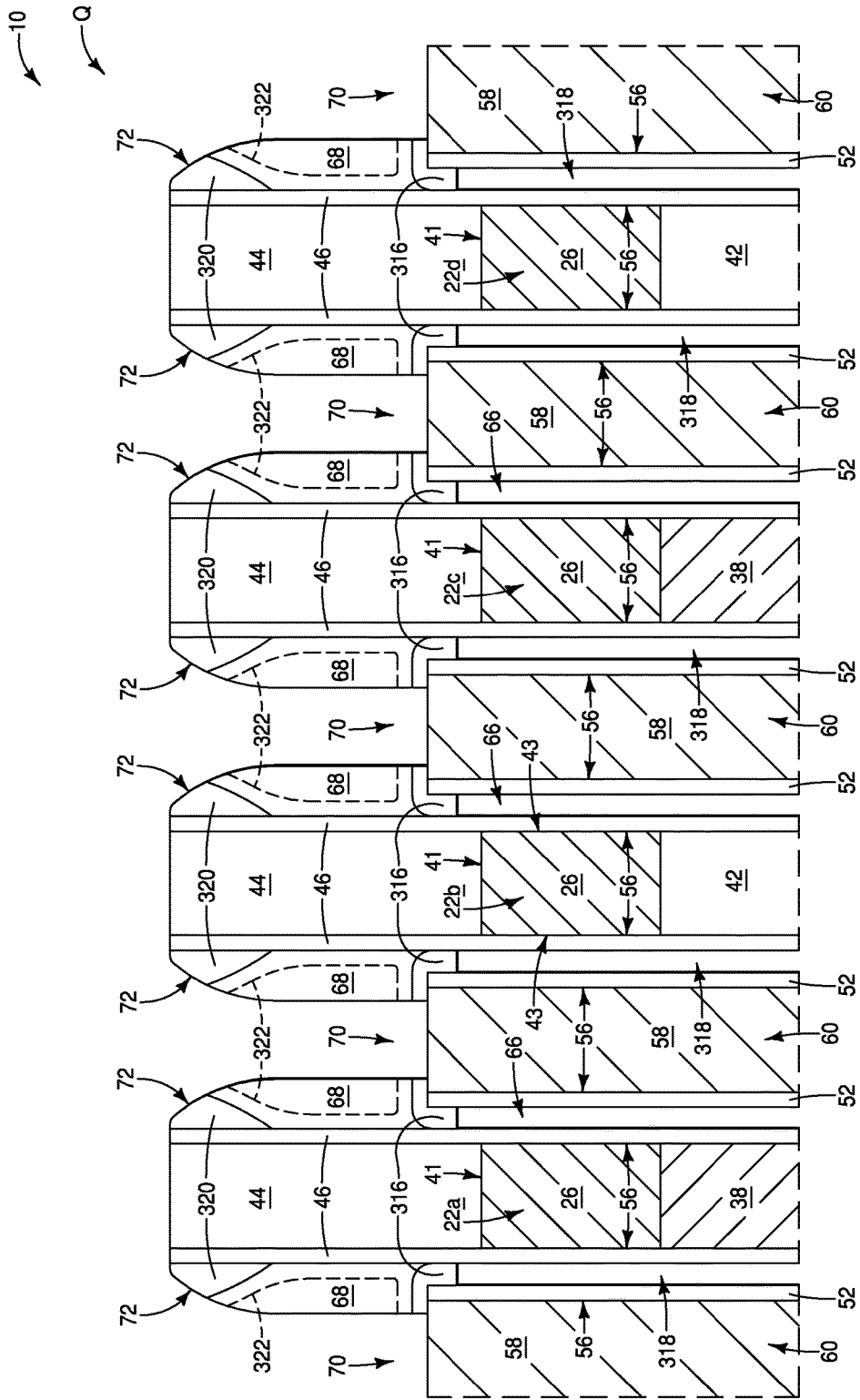

Referring to FIG. 15, portions of the second insulative material 68, the sealant material 316, the optional material 322 (if such optional material is present) and the material 320 of the masses 312 are removed. Such removal exposes regions 70 of the conductive interconnects 60. The removal of materials 316, 322, 320 and 68 may be accomplished utilizing anisotropic etching of such materials, which forms the materials 68, 316, 322 (if present) and 320 into spacers 72.

Figure 16:
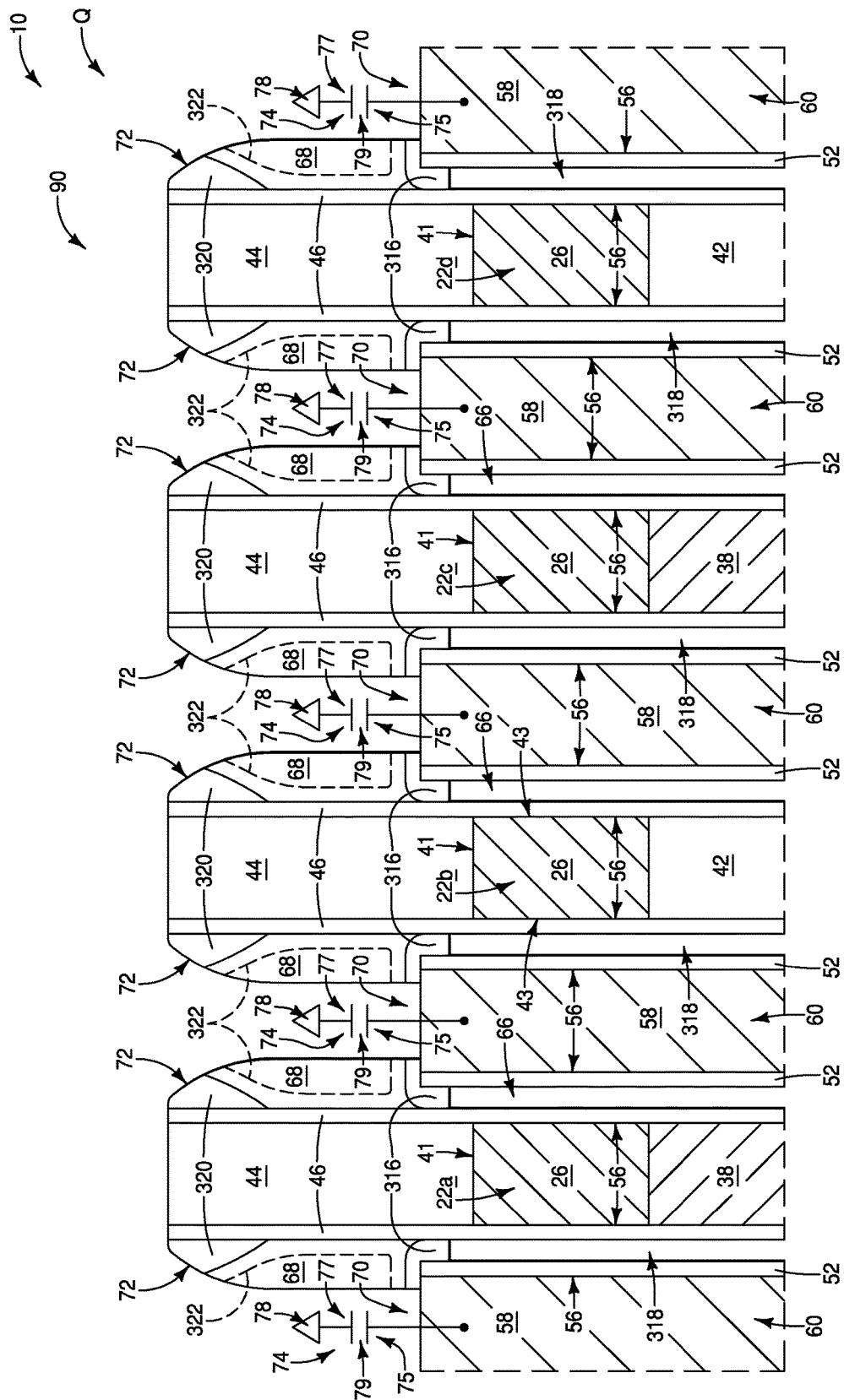

Referring to FIG. 16, the exposed regions 70 of the interconnects 60 are coupled with capacitors 74. Each capacitor has a node 75 connected with an interconnect 60, and has another node 77 connected with a reference voltage 78. The reference voltage may be ground or any other suitable voltage. The nodes 75 and 77 are spaced from one another by dielectric regions 79. Such dielectric regions may comprise any suitable dielectric material(s).

The capacitors 74 are examples of charge-storage devices which may be coupled with the conductive interconnects 60. In other embodiments, other suitable charge-storage devices may be utilized. Accordingly, it is to be understood that the so-called capacitor-contact locations 34 may be more generically referred to as charge-storage-device-contact locations.

The configuration of FIG. 16 comprises conductive structures 22 having top surfaces 41 and sidewall surfaces 43 (only some of which are labeled). The insulative material 44 is over the top surfaces. The voids 318 are along the sidewall surfaces, and are laterally spaced from such sidewall surfaces by the insulative material 46. In some embodiments, the insulative materials 44 and 46 may be referred to as first and second insulative materials, respectively. Such first and second insulative materials may comprise a same composition as one another (for instance, may both comprise silicon nitride), or may comprise different compositions relative to one another.

The voids 318 have low dielectric constants, and thus form regions of low permittivity between the digit lines 22 and the conductive interconnects 60. Such low-permittivity regions may reduce, or even entirely eliminate, problematic parasitic capacitance between the conductive structures 22 and the conductive interconnects 60 as compared to conventional configurations lacking such low-permittivity regions.

The configuration of FIG. 16 may be considered to correspond to a region of a memory array 90 (for instance, a DRAM array). The memory array comprises memory cells which include an access transistor (e.g., a transistor comprising a gate along one of the wordlines 20 of FIGS. 3-7) coupled with a charge-storage device (e.g., a capacitor 74). An example memory array 90 is described with reference to FIG. 17. The memory array includes digit lines (DL1-DL4) corresponding to the digit lines 22a-d, and includes wordlines (WL1-WL4) corresponding to the wordlines 20. Memory cells 80 comprise transistors 82 coupled with the capacitors 74. Each of the transistors comprises a gate 84 along one of the wordlines 20. Each of the memory cells 80 is uniquely addressed through the combination of a wordline and a digit line.

Figure 17:
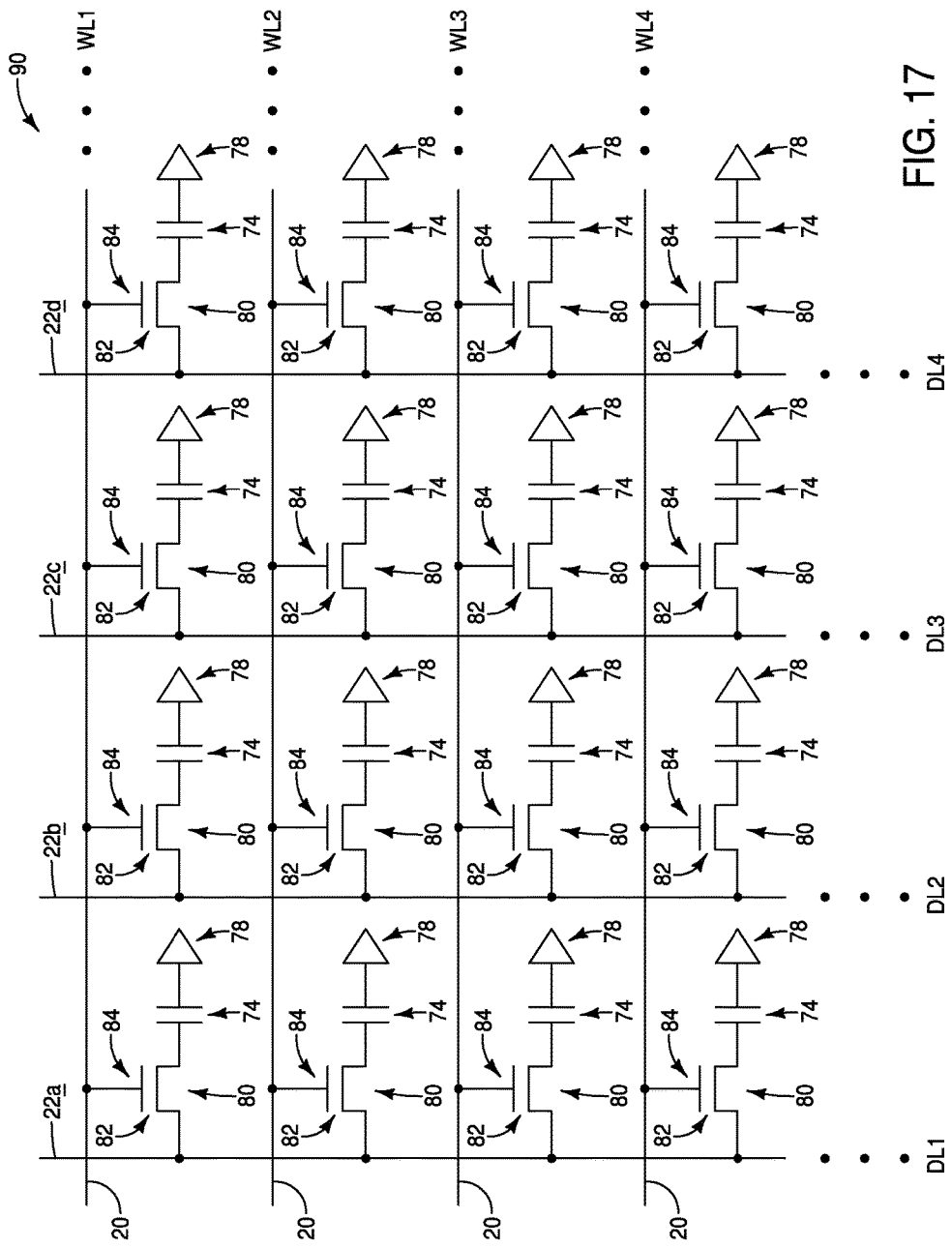
FIG. 17 is a diagrammatic schematic view of a region of an example memory array.

The memory array 90 of FIG. 17 is a DRAM array in which each of the memory cells 80 comprises a transistor and a capacitor. In other embodiments, configurations analogous to that of FIG. 16 may be utilized in other memory arrays. Also, it is to be understood that the methodology described herein may be utilized to form other integrated assemblies in addition to, or alternatively to, memory arrays. For instance, the methodology may be applied to the fabrication of logic, sensors, etc.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include a method of forming an integrated assembly. A construction is formed to include a structure having an exposed surface, and to include an opening proximate the structure. An aperture extends into the opening. A first material is deposited to form a mass along the exposed surface of the structure. Particles are sputtered from the mass to form a sealant material which extends across the aperture and traps a void within the opening.

Some embodiments include a method of forming an integrated assembly. A construction is formed to include, along a cross-section, a conductive structure having a top surface, and a pair of opposing sidewall surfaces extending downwardly from the top surface. The construction also includes insulative material over the top surface, and includes rails along the sidewall surfaces. Each of the rails comprises a sacrificial material along a panel of a non-sacrificial material. The sacrificial material is removed to leave openings between the sidewall surfaces and the panels of the non-sacrificial material. A mass is formed over a top of the insulative material and along upper segments of sides of the insulative material. Particles are sputtered from the mass to form a sealant material which extends across the openings and traps voids within the openings.

Some embodiments include a method of forming an integrated assembly. A construction is formed to include, along a cross-section, a pair of digit lines spaced from one another by an intervening region. Each of the digit lines has a top surface, and a pair of opposing sidewall surfaces extending downwardly from the top surface. The construction includes insulative structures over the top surfaces, and includes rails along the sidewall surfaces. The rails comprise a sacrificial material sandwiched between a pair of panels. The construction includes a conductive interconnect within the intervening region. The insulative structures comprise a first insulative material. The sacrificial material is removed to leave openings between the panels. Masses are formed over tops of the insulative structures and along upper segments of sides of the insulative structures. Particles are sputtered from the masses to form a sealant material which extends across the openings and covers voids within the openings. A second insulative material is formed across the insulative structures, across the sealant material and across the conductive interconnect. A portion of the second insulative material is removed to expose a region of the conductive interconnect. The exposed region of the conductive interconnect is coupled with a charge-storage device.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

I claim:

1. A method of forming an integrated assembly, comprising:
    forming a construction to include, along a cross-section, a conductive structure having a top surface, and a pair of opposing sidewall surfaces extending downwardly from the top surface; the construction also including insulative material over the top surface, and including panels along the sidewall surfaces; openings being between the sidewall surfaces and the panels;
    forming a mass adjacent the insulative material; and
    sputtering particles from the mass to form a sealant material which extends across the openings and traps voids within the openings.

2. The method of claim 1 further comprising treating the sealant material to fill any pinholes present in the sealant material.

3. The method of claim 2 wherein the insulative material is a first insulative material, and wherein the treating comprises deposition of a layer of a second insulative material over the sealant material.

4. The method of claim 1 wherein the mass comprises one or more elements selected from group 14 of the periodic table.

5. The method of claim 1 wherein the mass comprises silicon.

6. The method of claim 1 wherein the sealant material comprises silicon dioxide.

7. The method of claim 1 wherein the sputtering is conducted under oxidizing conditions.

8. A method of forming an integrated assembly, comprising:
    forming a construction to include, along a cross-section, a pair of digit lines spaced from one another by an intervening region; each of the digit lines having a top surface, and a pair of opposing sidewall surfaces extending downwardly from the top surface; the construction including insulative structures over the top surfaces, and including rails along the sidewall surfaces; the rails comprising a sacrificial material sandwiched between a pair of panels; the construction including a conductive interconnect within the intervening region; the insulative structures comprising a first insulative material; the sacrificial material comprising silicon dioxide and the panels comprising silicon nitride;
    removing the sacrificial material to leave openings between the panels;
    forming masses over tops of the insulative structures;
    sputtering particles from the masses to form a sealant material which extends across the openings and covers voids within the openings;
    forming a second insulative material across the insulative structures, across the sealant material and across the conductive interconnect;
    removing a portion of the second insulative material to expose a region of the conductive interconnect; and
    coupling the exposed region of the conductive interconnect with a capacitor.

9. The method of claim 8 further comprising treating the sealant material to fill any pinholes present in the sealant material.

10. The method of claim 9 wherein the treating comprises deposition of a layer of a third insulative material over the sealant material.

11. The method of claim 10 wherein the third insulative material comprises a same composition as the sealant material.

12. The method of claim 11 wherein the third insulative material and the sealant material both comprise silicon dioxide.

13. The method of claim 10 wherein the third insulative material comprises a different composition than the sealant material.

14. The method of claim 13 wherein the third insulative material comprises silicon nitride, and wherein the sealant material comprises silicon dioxide.

15. The method of claim 8 wherein the mass comprises one or more elements selected from group 14 of the periodic table.

16. The method of claim 15 wherein the sealant material comprises silicon dioxide.

\* \* \* \* \*